(12) United States Patent
Kaneko

(10) Patent No.: US 12,014,939 B2
(45) Date of Patent: Jun. 18, 2024

(54) DEVICE FOR MANUFACTURING SEMICONDUCTOR SUBSTRATE COMPRISING TEMPERATURE GRADIENT INVERSION MEANS AND METHOD FOR MANUFACTURING SEMICONDUCTOR SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 388 days.

(21) Appl. No.: 17/600,087

(22) PCT Filed: Mar. 25, 2020

(86) PCT No.: PCT/JP2020/013202
§ 371 (c)(1),
(2) Date: Sep. 29, 2021

(87) PCT Pub. No.: WO2020/203516
PCT Pub. Date: Oct. 8, 2020

(65) Prior Publication Data
US 2022/0189797 A1 Jun. 16, 2022

(30) Foreign Application Priority Data
Mar. 29, 2019 (JP) .................. 2019-069278

(51) Int. Cl.
*H01L 21/302* (2006.01)
*H01L 21/02* (2006.01)
*H01L 21/67* (2006.01)

(52) U.S. Cl.
CPC .. *H01L 21/67103* (2013.01); *H01L 21/02631* (2013.01); *H01L 21/302* (2013.01); *H01L 21/67248* (2013.01)

(58) Field of Classification Search
CPC .............. H01L 21/67103; H01L 21/67; H01L 21/02631; H01L 21/02; H01L 21/302;
(Continued)

(56) References Cited

U.S. PATENT DOCUMENTS 5,989,340 A * 11/1999 Stephani ................. C30B 29/36
117/106
9,028,612 B2 * 5/2015 Bondokov .............. C30B 23/06
117/88

(Continued)

FOREIGN PATENT DOCUMENTS

JP 2003238299 A 8/2003
JP 2013075789 A 4/2013
(Continued)

OTHER PUBLICATIONS

EPO Communication and European Search Report issued in EP application No. 20783505.9 dated Nov. 18, 2022.
(Continued)

*Primary Examiner* — Nikolay K Yushin
(74) *Attorney, Agent, or Firm* — Calfee, Halter & Griswold LLP

(57) ABSTRACT

Provided are a method for etching and growing a semiconductor substrate in the same device system, and a device therefor. The method for manufacturing a semiconductor substrate includes a first heating step of heating a heat
(Continued)

treatment space which contains a semiconductor substrate and a transmission/reception body that transports atoms between the semiconductor substrate and the transmission/reception body such that a temperature gradient is formed between the semiconductor substrate and the transmission/reception body, and a second heating step of heating the same with the temperature gradient being vertically inverted.

10 Claims, 5 Drawing Sheets

(58) Field of Classification Search
CPC . H01L 21/67248; C30B 23/06; C30B 23/063; C30B 23/066; C30B 29/36; C30B 29/10; C30B 29/00
See application file for complete search history.

(56) References Cited

U.S. PATENT DOCUMENTS

| | | | | |
|---|---|---|---|---|
| 9,228,274 | B2* | 1/2016 | Rengarajan | C23C 14/541 |
| 11,359,307 | B2* | 6/2022 | Kaneko | C30B 23/063 |
| 2010/0139552 | A1* | 6/2010 | Rengarajan | C30B 23/06 |
| | | | | 118/726 |
| 2012/0000414 | A1* | 1/2012 | Bondokov | C30B 23/002 |
| | | | | 118/724 |
| 2014/0319539 | A1 | 10/2014 | Kaneko | |
| 2019/0136409 | A1* | 5/2019 | Kaneko | H01L 21/02378 |

FOREIGN PATENT DOCUMENTS

| | | | |
|---|---|---|---|
| JP | 2016-092073 | * 4/2016 | ............ H01L 21/02 |
| JP | 2017066019 A | 4/2017 | |
| JP | 2018-158858 A | 10/2018 | |
| TW | 201314839 A1 | 4/2013 | |
| WO | 2014199615 A1 | 12/2014 | |
| WO | 2016079983 A1 | 5/2016 | |
| WO | 2017053883 A1 | 3/2017 | |
| WO | 2017188381 A1 | 11/2017 | |
| WO | 2018174105 A1 | 9/2018 | |

OTHER PUBLICATIONS

English Translation of PCT/JP2020/013202 dated Jun. 9, 2020 (2 pages).
English translation of Office Action from Chinese Application No. 202080024455.0 dated Apr. 11, 2023 (6 pages).

* cited by examiner

DEVICE FOR MANUFACTURING SEMICONDUCTOR SUBSTRATE COMPRISING TEMPERATURE GRADIENT INVERSION MEANS AND METHOD FOR MANUFACTURING SEMICONDUCTOR SUBSTRATE

CROSS-REFERENCE TO RELATED APPLICATIONS

This application is a 371 of PCT Application No. PCT/JP2020/013202, filed on Mar. 25, 2020, which claims priority to Japanese Application No. 2019-069278, filed on Mar. 29, 2019, the contents of which are hereby incorporated by reference as if recited in their entirety.

TECHNICAL FIELD

The present invention relates to a method for manufacturing a semiconductor substrate and a device for manufacturing a semiconductor substrate.

BACKGROUND ART

Conventionally, a method of etching a semiconductor substrate for the purpose of removing damage to the semiconductor substrate is known.

For example, Patent Literature 1 describes an etching method for a SiC substrate in which a SiC substrate is accommodated in an accommodation container provided with a tantalum carbide layer and a tantalum silicide layer on an internal space side, and heated under vapor pressure of Si.

By subjecting the semiconductor substrate subjected to such an etching step to epitaxial growth, a high-quality semiconductor single crystal with fewer defects can be obtained.

CITATION LIST

Patent Literature

Patent Literature 1: WO 2016/079983 A

SUMMARY OF INVENTION

Technical Problem

By the way, generally, etching and growth are performed using different devices under different environments, which is costly.

With an increase in demand for semiconductor materials in recent years, there is a demand for a method for etching and growing a semiconductor substrate in the same device system, and a device therefor.

Therefore, an object of the present invention is to provide a method for etching and growing a semiconductor substrate in the same device system, and a device therefor.

Solution to Problem

The present invention to solve the above problem is a method for manufacturing a semiconductor substrate, the method including:
a first heating process of heating a heat treatment space accommodating a semiconductor substrate and a release and reception body that transports atoms to and from the semiconductor substrate in a manner that a temperature gradient is formed between the semiconductor substrate and the release and reception body; and a second heating process of reversing the temperature gradient and heating the temperature gradient.

As described above, the semiconductor substrate is heated so as to form a temperature gradient between the semiconductor substrate and the release and reception body, and thereby, etching or growth of the semiconductor substrate occurs using the temperature gradient as a driving force.

According to the method for manufacturing a semiconductor substrate of the present invention, the growth and the etching can be switched in the same device system by reversing the temperature gradient between the semiconductor substrate and the release and reception body.

In a preferred embodiment of the present invention, the heating process is performed in a semi-closed space.

By heating in the semi-closed space, it is possible to suppress an unintended reaction of the semiconductor substrate and the release and reception body.

In a preferred embodiment of the present invention, the heating process is performed under an atmosphere containing an atomic species constituting the semiconductor substrate.

The present invention to solve the above problem is a device for manufacturing a semiconductor substrate including:
a main container that accommodates a semiconductor substrate;
a heating furnace including a heating chamber that accommodates the main container, and a heating means that performs heating so as to form a temperature gradient between the semiconductor substrate and the release and reception body; and
a temperature gradient inversion means that inverts high and low of the temperature gradient.

According to the device for manufacturing a semiconductor substrate of the present invention, etching and growth of the semiconductor substrate can be performed in the same device system.

In a preferred embodiment of the present invention, the temperature gradient inversion means is a temperature control means that controls a temperature in the main container in the heating means.

In a preferred embodiment of the present invention, as the temperature control means, a means that controls a heat generation amount of the heating means is included.

In a preferred embodiment of the present invention, as the temperature control means, a means that controls a position or orientation of the heating means is included.

In a preferred embodiment of the present invention, the temperature gradient inversion means is a main container control means that controls a position or orientation of the main container.

In a preferred embodiment of the present invention, the temperature gradient inversion means is a heat radiation means that radiates heat in the heating chamber to an outside of the heating chamber.

In a preferred embodiment of the present invention, as the temperature gradient inversion means, two or more types of temperature gradient inversion means selected from a temperature control means that controls a temperature in the main container in the heating means, a main container control means that controls a position or orientation of the main container, and a heat radiation means that releases heat in the heating chamber to an outside of the heating chamber are included.

The main container is made of a material containing an atomic species constituting the semiconductor substrate. As described above, since the main container is made of a material containing an atomic species constituting the semiconductor substrate, the main container itself can be used as a release and reception body by the heating furnace.

In a preferred embodiment of the present invention, a high melting point container that accommodates the main container is further provided.

By providing such a high melting point container, unintended reactions of the semiconductor substrate and the main container can be suppressed.

The present invention to solve the above problem is a device for manufacturing a semiconductor substrate including:

a main container that accommodates a semiconductor substrate and a release and reception body that transports atoms to and from the semiconductor substrate; and a heating furnace including a heating chamber that accommodates the main container, and a heating means that performs heating in a manner to form a temperature gradient between the semiconductor substrate and the release and reception body, in which at least a first heating chamber and a second heating chamber are provided as the heating chamber, and high and low of a temperature gradient of the second heating chamber is opposite to high and low of a temperature gradient of the first heating chamber.

According to the device for manufacturing a semiconductor substrate of the present invention, etching and growth of the semiconductor substrate can be performed in the same device system.

In a preferred embodiment of the present invention, the first heating chamber and the second heating chamber are adjacent to each other via the heating means.

With such a configuration, high and low of the temperature gradient of the first heating chamber and the temperature gradient of the second heating chamber can be made opposite to each other.

In a preferred embodiment of the present invention, the first heating chamber and the second heating chamber each include an independent heating means.

With such a configuration, high and low of the temperature gradient of the first heating chamber and the temperature gradient of the second heating chamber can be made opposite to each other.

In a preferred embodiment of the present invention, heat insulating materials having different thicknesses are respectively provided in the first heating chamber and the second heating chamber.

Advantageous Effects of Invention

According to the disclosed technology, etching and growth of a semiconductor substrate can be performed in the same device, manufacturing cost of the semiconductor substrate is reduced, and manufacturing efficiency is improved.

DESCRIPTION OF EMBODIMENTS

[Method for Manufacturing Semiconductor Substrate]

In a method for manufacturing a semiconductor substrate (hereinafter, simply referred to as a manufacturing method) of the present invention, a semiconductor substrate and a release and reception body that transports atoms to and from the semiconductor substrate are accommodated in a space (heat treatment space) in which heat treatment is performed. The method includes a first heating process of performing heating so as to form a temperature gradient between the semiconductor substrate and the release and reception body.

In the present specification, the release and reception body is a generic term for materials containing an atomic species constituting a semiconductor substrate, and for transmitting or receiving atoms to and from the semiconductor substrate by heating a heat treatment space.

The method includes a second heating process of reversing the temperature gradient and performing heating again.

Specifically, in a case where the semiconductor substrate is heated at a relatively low temperature and the release and reception body is heated at a relatively high temperature in the first heating process, in the second heating process, the semiconductor substrate is heated at a relatively high temperature and the release and reception body is heated at a relatively low temperature.

Hereinafter, a manufacturing method according to an embodiment of the present invention will be described in detail with reference to the drawings. The technical scope of the present invention is not limited to the embodiments illustrated in the accompanying drawings, and can be appropriately changed within the scope described in the claims.

Figure 1:
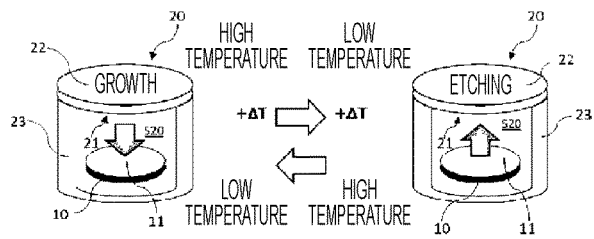
FIG. 1 is a conceptual diagram illustrating a method for manufacturing a semiconductor substrate of the present invention.

FIG. 1 is a conceptual diagram illustrating a concept of a manufacturing method according to an embodiment of the present invention.

In the manufacturing method of the present embodiment, a semiconductor substrate 10 including a main surface 11 is accommodated in a heat treatment space S20 in the main container 20.

In the present specification, the main surface refers to a surface on which the semiconductor substrate 10 is grown or etched.

As the main surface, a surface provided with an off angle of 0.4 to 8° from (0001) surface or (000-1) surface can be exemplified.

The main container 20 is a fitting container including an upper container 22 and a lower container 23 that can be fitted to each other. A minute gap 24 is formed in a fitting portion between the upper container 22 and the lower container 23, and the inside of the main container 20 can be exhausted (evacuated) from the gap 24.

In the present embodiment, the semiconductor substrate 10 is a SiC substrate.

In the present embodiment, the main container 20 is made of a material containing polycrystalline SiC, and a portion of the main container 20 facing the main surface 11 of the semiconductor substrate 10 serves as the release and reception body 21.

By heating the heat treatment space S20 so as to form a temperature gradient between the semiconductor substrate 10 and the power release and reception body 21, atomic species constituting the semiconductor substrate are transported using this temperature difference as a driving force.

Figure 2:
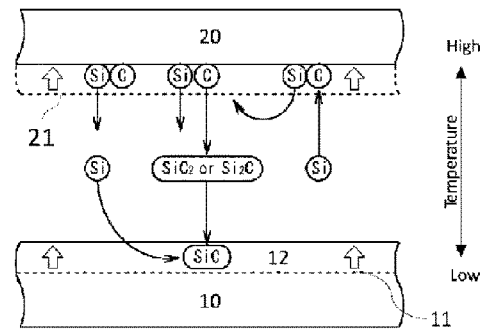
FIG. 2 is a conceptual diagram illustrating a growth mechanism of a semiconductor substrate according to the present embodiment.

FIG. 2 is an explanatory diagram illustrating an outline of a growth mechanism of the manufacturing method according to the present embodiment.

The heat treatment space S20 is heated in a temperature range of equal to or higher than 1400° C. and equal to or lower than 2300° C., the semiconductor substrate 10 is arranged on the low temperature side of the temperature gradient, and the release and reception body 21 is arranged on the high temperature side of the temperature gradient, and thereby, the reactions of the following 1) to 5) proceed, and the growth layer 12 is formed on the main surface 11.

1) Poly-SiC(s)→Si(v)+C(s)
2) 2C(s)+Si(v)→SiC$_2$(v)
3) C(s)+2Si(v)→Si$_2$C(v)
4) Si(v)+SiC$_2$(v)→2SiC(s)
5) Si$_2$C(v)→Si(v)+SiC(s)

Explanation of 1): When the main container 20 (Poly-SiC(s)) is heated, Si atoms (Si(v)) are desorbed from SiC by thermal decomposition.

Explanation of 2) and 3): C (C(s)) remaining on the main surface 11 due to desorption of Si atoms (Si(v)) reacts with Si vapor (Si(v)) in the main container 20 to become Si$_2$C, SiC$_2$, or the like, and is sublimated in the main container 20.

Explanation of 4) and 5): Sublimed Si$_2$C, SiC$_2$, or the like reaches and diffuses at the terrace of the main surface 11 due to a temperature gradient, and reaches a step, so that the growth layer 12 grows by taking over the polymorph of the release and reception body 21 (step flow growth).

That is, the growth of the semiconductor substrate 10 according to the present embodiment includes a Si atom sublimation process of thermally sublimating Si atoms from the inside of the main container 20, and an atom sublimation process of sublimating C atoms remaining on the main surface 11 by reacting the C atoms with Si atoms in the main container 20.

Figure 3:
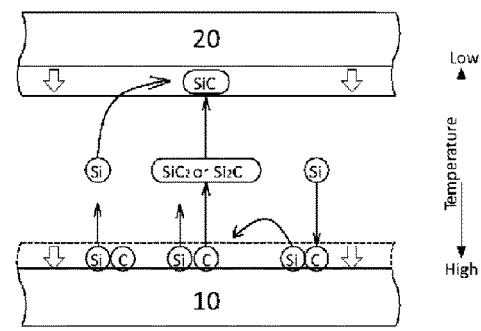
FIG. 3 is a conceptual diagram illustrating an etching mechanism of the semiconductor substrate according to the present embodiment.

FIG. 3 is an explanatory diagram illustrating an outline of an etching mechanism of the manufacturing method according to the present embodiment.

The heat treatment space S20 is heated in a temperature range of equal to or higher than 1400° C. and equal to or lower than 2300° C., the semiconductor substrate 10 is arranged on the high temperature side of the temperature gradient, and the release and reception body 21 is arranged on the low temperature side of the temperature gradient, and thereby, the reactions of the following 1) to 5) proceed, and as a result, etching of the semiconductor substrate 10 proceeds.

1) SiC(s)→Si(v)+C(s)
2) 2C(s)+Si(v)→SiC$_2$(v)
3) C(s)+2Si(v)→Si$_2$C(v)
4) Si(v)+SiC$_2$(v)→2SiC(s)
5) Si$_2$C(v)→Si(v)+SiC(s)

Explanation of 1): When the semiconductor substrate (SiC(s)) is heated, Si atoms (Si(v)) are desorbed from the main surface 11 by thermal decomposition (Si atom sublimation process).

Explanation of 2) and 3): C (C(s)) remaining on the main surface 11 due to desorption of Si atoms (Si(v)) reacts with Si vapor (Si(v)) in the main container 20 to become Si$_2$C, SiC$_2$, or the like, and is sublimated in the main container 20 (C atom sublimation process).

Explanation of 4) and 5): Sublimed Si$_2$C, SiC$_2$, or the like reaches the main container 20 (polycrystalline SiC) by a temperature gradient and grows.

That is, the etching process according to the present embodiment includes a Si atom sublimation process of thermally sublimating Si atoms from the surface of the semiconductor substrate 10, and a C atom sublimation process of sublimating C atoms by combining C atoms remaining on the main surface 11 of the semiconductor substrate 10 with Si atoms in the main container 20.

The method for manufacturing a semiconductor substrate according to the present invention utilizes the fact that the growth and etching of the semiconductor substrate can be switched by high and low of the temperature gradient generated between the semiconductor substrate and the release and reception body.

That is, growth or etching of the semiconductor substrate is performed in the first heating process, and a reaction opposite to the reaction caused in the first heating process is caused in the second heating process in which the temperature gradient is reversed.

As described above, according to the manufacturing method of the present invention, the behavior of the semiconductor substrate can be controlled by high and low of the temperature gradient, and the growth and the etching can be performed in the same device system.

In the present embodiment, a form in which a SiC substrate is used as a semiconductor substrate has been exemplified, but the present invention is not limited thereto, and any semiconductor substrate can be adopted.

As the semiconductor substrate, a semiconductor substrate that can be grown by a vapor phase method is preferably used.

In the present embodiment, the form in which the main container serves as a release and reception body has been exemplified, but the release and reception body is not particularly limited as long as it is a material containing an atomic species constituting the semiconductor substrate.

For example, a form may be adopted in which a material containing an atomic species constituting the semiconductor substrate is accommodated inside the main container separately from the main container. That is, the heating process may be performed under an atmosphere containing an atomic species constituting the semiconductor substrate. The atmosphere containing the atomic species constituting the semiconductor substrate includes an atmosphere in which the atomic species constituting the semiconductor substrate are generated by heating.

In a case of using the main container as a release and reception body, a main container made of a material containing an atomic species constituting a semiconductor substrate can be used.

In the manufacturing method of the present invention, it is not necessary to use the main container, and the semiconductor substrate and the release and reception body may be accommodated in the heat treatment space.

The heat treatment space is preferably a semi-closed space. The semi-closed space can be formed, for example, by accommodating the semiconductor substrate 10 and the release and reception body 21 in the main container 20.

The semi-closed space in the present specification refers to a space in which the inside of the container can be evacuated but at least a part of the steam generated in the container can be confined.

By forming the semi-closed space, it is possible to suppress an unintended reaction of the semiconductor substrate and the release and reception body.

The growth temperature and the etching temperature in this method are preferably set in a range of 800 to 2500° C.

The growth rate and the etching rate in this method can be controlled by the above temperature range, and can be selected in the range of 0.001 to 2 μm/min.

The growth time and the etching time in this method can be set to any time so as to obtain a desired growth amount and etching amount. For example, when the growth rate (etching rate) is 1 μm/min and the growth amount (etching amount) is desired to be 1 μm, the growth amount (etching time) is 1 minute.

The temperature gradient in this method is set in a range of 0.1 to 5° C./mm between the semiconductor substrate and the release and reception body.

In the present method, a dopant gas ($N_2$ or the like) can be supplied, and can be introduced into the main heating chamber 41 at $10^{-5}$ to 10000 Pa.

In the growth process, the doping concentration of the growth layer 12 can be adjusted by supplying the dopant gas into the main container 20.

That is, in a case where the dopant gas is not supplied, the growth layer 12 is formed with the same doping concentration as that of the main container 20. On the other hand, the doping concentration in the growth layer 12 can be increased by supplying the dopant gas, and thereby, the growth layer 12 having a desired doping concentration can be formed.

As a means for inverting the temperature gradient in the manufacturing method of the present invention, a method of inverting the semiconductor substrate 10 itself can be exemplified.

For example, the semiconductor substrate 10 is arranged so as to be separated from the bottom surface of the main container 20 using a jig.

Then, in a case where the main surface 11 of the main container is arranged so as to face the release and reception body 21, when heating is performed so that the bottom surface of the main container is on the low temperature side and the top surface (release and reception body 21) of the main container is on the high temperature side, as described above, a temperature gradient is formed in which the main surface 11 is on the low temperature side and the release and reception body 21 is on the high temperature side, and the growth layer 12 grows on the main surface 11.

Next, when the semiconductor substrate 10 is inverted and the main surface 11 (growth layer 12) is arranged so as to face the bottom surface of the main container 20, and similarly, heating is performed so that the bottom surface of the main container is on the low temperature side and the top surface of the main container (release and reception body 21) is on the high temperature side, a temperature gradient is formed in which the bottom surface side of the main container is on the low temperature side and the main surface 11 (growth layer 12) is on the high temperature side, and etching of the main surface 11 proceeds.

In this mode, it is possible to invert the relative temperature gradient between the main surface 11 and the facing release and reception body 21 (top surface or bottom surface in main container 20) without changing the temperature gradient itself in the heating chamber.

The means for inverting the temperature gradient in the manufacturing method of the present invention is not particularly limited, but a temperature gradient inversion means included in a device for manufacturing a semiconductor substrate to be described in detail below can be exemplified.

[Device for Manufacturing Semiconductor Substrate]

Hereinafter, while omitting description of matters common to the above-described method for manufacturing a semiconductor substrate, a description will be given to a device for manufacturing a semiconductor substrate (hereinafter, simply referred to as a manufacturing device) of the present invention.

A manufacturing device includes:
 a main container that accommodates a semiconductor substrate and a release and reception body;
 a heating furnace including a heating chamber that accommodates the main container, and a heating means that performs heating so as to form a temperature gradient between the semiconductor substrate and the release and reception body; and
 a temperature gradient inversion means that inverts high and low of the temperature gradient.

The manufacturing device of the present invention includes:
 a main container that accommodates a semiconductor substrate and a release and reception body that transports atoms to and from the semiconductor substrate; and
 a heating furnace including a heating chamber that accommodates the main container, and a heating means that performs heating in a manner to form a temperature gradient between the semiconductor substrate and the release and reception body,
 in which at least a first heating chamber and a second heating chamber are provided as the heating chamber, and
 high and low of a temperature gradient of the second heating chamber is opposite to high and low of a temperature gradient of the first heating chamber.

Specifically, the second heating chamber is configured such that a temperature gradient is opposite in high and low to a temperature gradient formed between the semiconductor substrate accommodated in the first heating chamber and the release and reception body by the heating means.

Hereinafter, the manufacturing device according to the present embodiment will be described in detail with reference to FIGS. 4 to 11.

Figure 4:
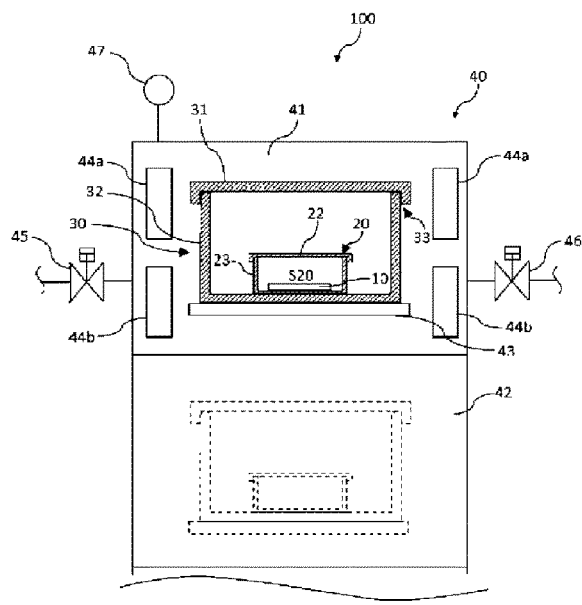
FIG. 4 is a diagram illustrating a manufacturing device including a temperature control means according to Example 1.

FIG. 4 illustrates a manufacturing device according to Example 1 including a temperature control means as a temperature gradient inversion means.

<Example 1> Manufacturing Device Including Temperature Control Means

The manufacturing device 100 according to Example 1 includes the main container 20 capable of accommodating the semiconductor substrate 10 and containing a material containing an atomic species constituting the semiconductor substrate 10. In Example 1, a part of the main container 20 serves as the release and reception body 21.

The manufacturing device 100 includes a high melting point container 30 that accommodates the main container 20, a main heating chamber 41 that accommodates the high melting point container 30, and a heating furnace 40 having a heating means 44 that forms a temperature gradient between the semiconductor substrate 10 and the release and reception body 21.

The high melting point container 30 contains a high melting point material. As the high melting point material, for example, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, $TiB_2$ which are borides, polycrystalline SiC, and the like can be exemplified.

Figure 5:
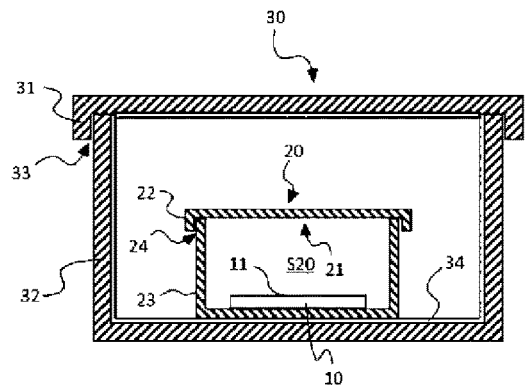
FIG. 5 is a diagram illustrating the manufacturing device including the temperature control means according to Example 1.

The atmosphere containing the atomic species constituting the semiconductor material in the main heating chamber 41 according to the present embodiment includes a vapor supply source 34 capable of supplying vapor pressure of the gaseous species containing the atomic species constituting the semiconductor substrate 10 into the main container 20 (see FIG. 5). It is sufficient that the vapor supply source 34 is configured to generate the vapor pressure of the gaseous species in the high melting point container 30 during the heat treatment. For example, when the semiconductor substrate 10 is a SiC substrate, solid Si (Si pellet such as a single crystal Si piece or Si powder) and a Si compound can be exemplified.

As similar to the main container 20, the high melting point container 30 is a fitting container including an upper container 31 and a lower container 32 that can be fitted to each other, and is configured to be able to accommodate the main container 20. A minute gap 33 is formed in a fitting portion between the upper container 31 and the lower container 32, and the inside of the high melting point container 30 can be exhausted (evacuated) from the gap 33.

By providing such a high melting point container 30, unintended carbonization of the semiconductor substrate and the main container can be suppressed.

The main heating chamber 41 can heat an object to be processed (the semiconductor substrate 10 or the like) to a temperature of equal to or higher than 800° C. and equal to or lower than 2500° C. The heating furnace 40 also includes a preheating chamber 42 capable of preheating the object to be processed to a temperature of equal to or higher than 500° C. The heating furnace 40 further includes a moving means 43 (moving table) that can move the object to be processed from the preheating chamber 42 to the main heating chamber 41.

The preheating chamber 42 of the present embodiment is configured to be capable of raising the temperature by residual heat of the heating means 44 of the main heating chamber 41. For example, when the temperature of the main heating chamber 41 is raised to 2000° C., the temperature of the preheating chamber 42 is raised to about 1000° C., and the object to be processed (semiconductor substrate 10, main container 20, high melting point container 30, and the like) can be degassed.

The moving means 43 is configured to be able to move the main heating chamber 41 and the preheating chamber 42 with the high melting point container 30 placed thereon. Since the transportation between the main heating chamber 41 and the preheating chamber 42 by the moving means 43 is completed in about 1 minute at the shortest, it is possible to realize temperature rise and temperature drop at 1 to 1000° C./min.

Since the rapid temperature raise and the rapid temperature drop can be performed in this manner, it is possible to observe a surface shape having no low-temperature growth history during temperature rise and temperature drop, which is difficult in conventional devices.

In FIG. 1, the preheating chamber 42 is arranged below the main heating chamber 41. However, the present invention is not limited to this, and the preheating chamber 42 may be arranged in any direction.

A vacuum forming valve 45 for exhausting the inside of the main heating chamber 41, an inert gas injection valve 46 for introducing an inert gas into the main heating chamber 41, and a vacuum gauge 47 for measuring the degree of vacuum in the main heating chamber are connected to the main heating chamber 41.

The vacuum forming valve 45 is connected to an evacuation pump that exhausts and evacuates the inside of the main heating chamber 41 (not illustrated). The degree of vacuum in the main heating chamber 41 can be adjusted to, for example, 10 Pa or lower, more preferably 1 Pa or lower, and still more preferably $10^{-3}$ Pa or lower by the vacuum forming valve 45 and the evacuation pump. Examples of the evacuation pump can include a turbo molecular pump.

The inert gas injection valve 46 is connected to an inert gas supply source (not illustrated). By the inert gas injection valve 46 and the inert gas supply source, the inert gas can be introduced into the main heating chamber 41 in the range of $10^{-5}$ to 10000 Pa. As the inert gas, Ar, He, $N_2$, or the like can be selected.

The inert gas injection valve 46 is a dopant gas supply means capable of supplying a dopant gas into the main container 20. That is, by selecting a dopant gas (for example, $N_2$ or the like) as the inert gas, the growth layer 12 can be doped with a dopant to increase the doping concentration.

The heating furnace 40 includes an upper heating means 44a and a lower heating means 44b as the heating means 44.

In Example 1, the amounts of heat generated by the upper heating means 44a and the lower heating means 44b can be individually adjusted. Therefore, by providing a difference in the amount of heat generated by the upper heating means 44a and the lower heating means 44b, a temperature gradient can be formed in the main heating chamber 41.

In the present embodiment, minute heat is released from the contact portion between a moving means 43 (moving table) and the high melting point container 30. Therefore, even if the amounts of heat generated by the upper heating means 44a and the lower heating means 44b are adjusted to be the same, a temperature gradient is formed between the semiconductor substrate 10 and the power release and reception body 21 by releasing heat from the moving means 43.

The temperature gradient thus formed can be inverted by adjusting the amount of heat generated by the upper heating means 44a and the lower heating means 44b. That is, by reversing high and low of the heat generation amount of the upper heating means 44a and the lower heating means 44b, high and low of the temperature gradient formed between the semiconductor substrate 10 and the release and reception body can be inverted.

As another embodiment, there can be exemplified a configuration in which a heating means is arranged on each of the top surface side and the bottom surface side in the main heating chamber 41, a difference in the heat generation amount is provided between the heating means on the top surface side and the heating means on the bottom surface side to form a temperature gradient, and the temperature gradient is inverted by reversing high and low of the heat generation amount by each heating means.

The temperature gradient inversion means of Example 1 is achieved by adjusting the heat generation amount of the heating means. However, the present invention is not limited thereto, and a mode in which the temperature gradient is inverted by reversing the vertical positional relationship of the heating means without changing the heat generation amount of the heating means may be adopted.

For example, a mode is considered in which different numbers of heating means are provided at the upper portion and the lower portion, or heating means (heaters) are juxtaposed such that the width increases from the upper portion to the lower portion (or from the lower portion to the upper portion) to form a temperature gradient.

In this case, the temperature gradient can be inverted by inverting the vertical positional relationship of the heating means.

In a mode including such a reversing mechanism of the heating means, it is not necessary to change the heat generation amount by each heating means, and it is possible to invert high and low of the temperature gradient formed between the semiconductor substrate 10 and the power release and reception body 21.

The heating means is not particularly limited, but a resistance heating type heater can be preferably exemplified.

As another embodiment, a mode can be exemplified in which a heating means is arranged on a side surface of the main heating chamber 41, and the heating means can move in the vertical direction with respect to the main heating chamber 41. In this case, the heating means is positioned relatively on the lower side or the upper side with respect to the main heating chamber 41 to form a temperature gradient between the semiconductor substrate 10 and the power release and reception body 21, and the heating means is moved upward or downward to invert high and low of the temperature gradient between the semiconductor substrate and the power release and reception body 21.

<Example 2> Manufacturing Device Including Main Container Control Means

A manufacturing device of Example 2 will be described while omitting matters common to Example 1.

Figure 6:
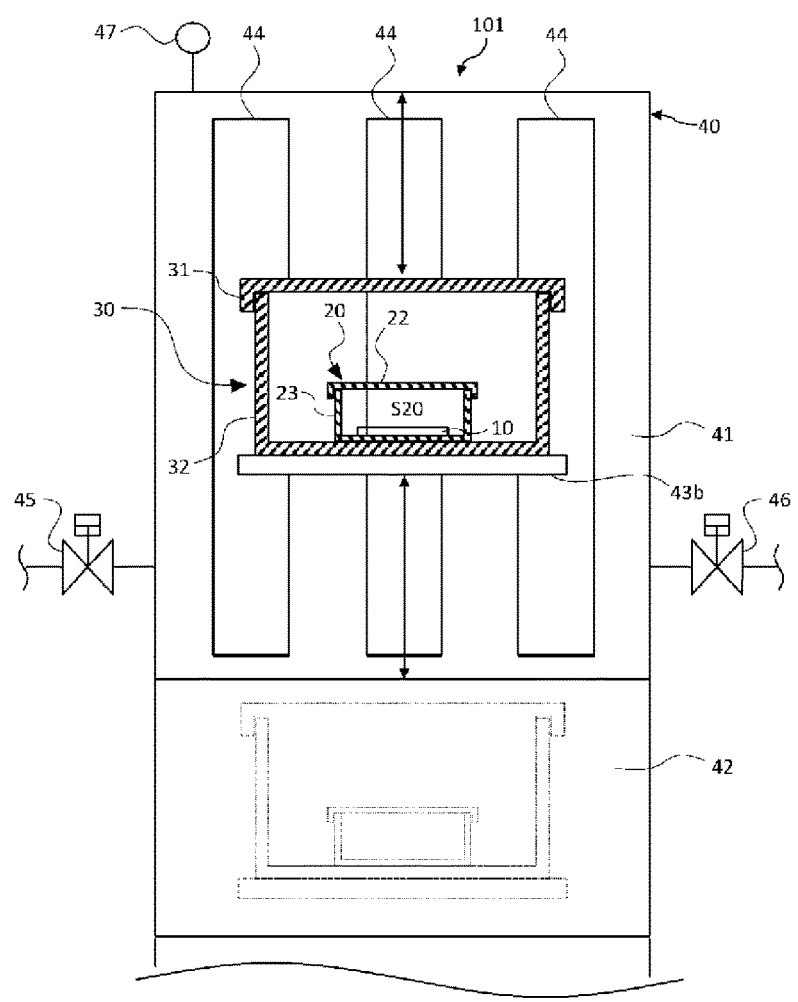
FIG. 6 is a diagram illustrating a manufacturing device including a main container control means according to Example 2.

FIG. 6 illustrates the manufacturing device 101 including a main container control means according to Example 2.

In the manufacturing device 101, the heating means 44 is arranged so as to surround the high melting point container 30 in the height direction of the main heating chamber 41.

When the heating means 44 is arranged in this manner, the temperature gradient in the inside of the main heating chamber 41 has the highest temperature in the vicinity of the center in the height direction of the main heating chamber, and the temperature decreases from the vicinity of the center toward the upper direction or the lower direction.

In Example 2, the moving means 43b is movable in the height direction in the main heating chamber 41, so that high and low of the temperature gradient between the semiconductor substrate 10 and the power release and reception body 21 can be inverted.

Specifically, by moving the release and reception body 21 so as to be positioned in the vicinity of the center of the main heating chamber 41, it is possible to form a temperature gradient in which the release and reception body 21 is on the high temperature side and the semiconductor substrate 10 is on the low temperature side, and it is possible to grow the semiconductor substrate 10 (see FIG. 6).

On the other hand, by moving the semiconductor substrate 10 so as to be positioned in the vicinity of the center of the main heating chamber 41, it is possible to form a temperature gradient in which the semiconductor substrate 10 is on the high temperature side and the release and reception body 21 is on the low temperature side, and it is possible to etch the semiconductor substrate 10.

In Example 2, the mode in which the moving means 43b is movable in the height direction in the main heating chamber has been exemplified, but the manufacturing device of the present invention may employ the main container control means that controls the position or orientation of the main container 20.

For example, by providing a rotation mechanism that rotates the main container 20 or the high melting point container 30 accommodating the main container 20, the positional relationship between the semiconductor substrate 10 and the release and reception body 21 in the height direction may be inverted. A mode of inverting the relative temperature gradient of the semiconductor substrate 10 by providing a rotation mechanism that inverts the semiconductor substrate 10 itself is also included as an embodiment of the manufacturing device including the main container control means. In this case, as described in "Method for manufacturing semiconductor substrate", the semiconductor substrate 10 is separated from the bottom surface of the main container 20 using a jig or the like.

Note that the moving means 43b of the manufacturing device of Example 2 can move between the main heating chamber 41 and the preheating chamber 42 similarly to the manufacturing device of Example 1. The mechanism that moves in the main heating chamber 41 and the mechanism that moves between the main heating chamber 41 and the preheating chamber 42 may be the same or different.

<Example 3> Manufacturing Device Including Heat Dissipating Means

A manufacturing device of Example 3 will be described while omitting matters common to Examples 1 and 2.

Figure 7:
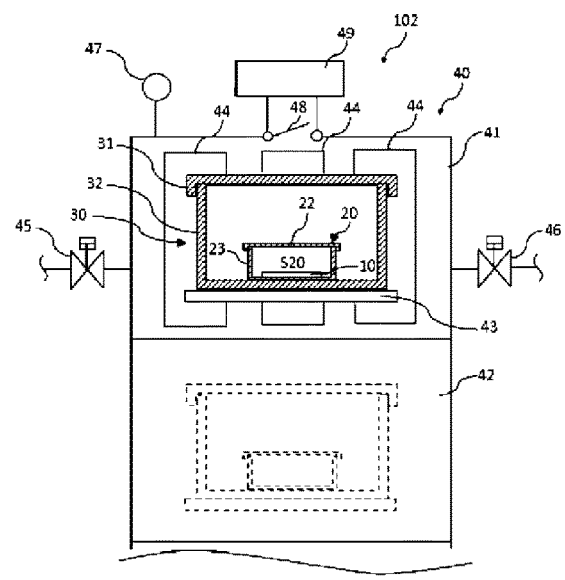
FIG. 7 is a diagram illustrating a manufacturing device including a heat dissipating means according to Example 3.

FIG. 7 illustrates the manufacturing device 102 including a heat dissipating means according to Example 3.

An opening and closing part 48 is provided on an upper surface of the main heating chamber 41 of the manufacturing device 102. The manufacturing device 102 includes a heat absorber 49 installed continuously to the main heating chamber 41 via the opening and closing part 48.

In a state where the opening and closing part 48 is opened, heat in the main heating chamber 41 is released to the heat absorber.

By controlling the open and close state of the opening and closing part 48, it is possible to control the temperature gradient in the main heating chamber 41, and eventually, it is possible to control high and low of the temperature gradient between the semiconductor substrate 10 and the power release and reception body 21.

Examples of the heat absorber include a heat dissipation sheet containing a material having a high melting point and a high thermal conductivity. As such a material, the above-described high melting point material can be exemplified.

In the present embodiment, the mode in which the opening and closing part 48 and the heat absorber 49 are provided in the upper portion of the main heating chamber 41 has been exemplified, but the opening and closing part 48 and the heat absorber 49 may be provided in any place as long as they are installed continuously to the main heating chamber 41.

The manufacturing device of the present invention is not limited to the embodiment including the opening and closing part 48 and the heat absorber 49, and a heat dissipating means capable of releasing the heat in the main heating chamber 41 to the outside of the main heating chamber 41 can be adopted. For example, a mode in which a heat dissipation space surrounded by a high melting point material is provided as heat dissipation means may be adopted.

<Example 4> Manufacturing Device Including Both Temperature Control Means and Main Container Control Means A manufacturing device of Example 4 will be described while omitting matters described in Examples 1 to 3.

Figure 8:
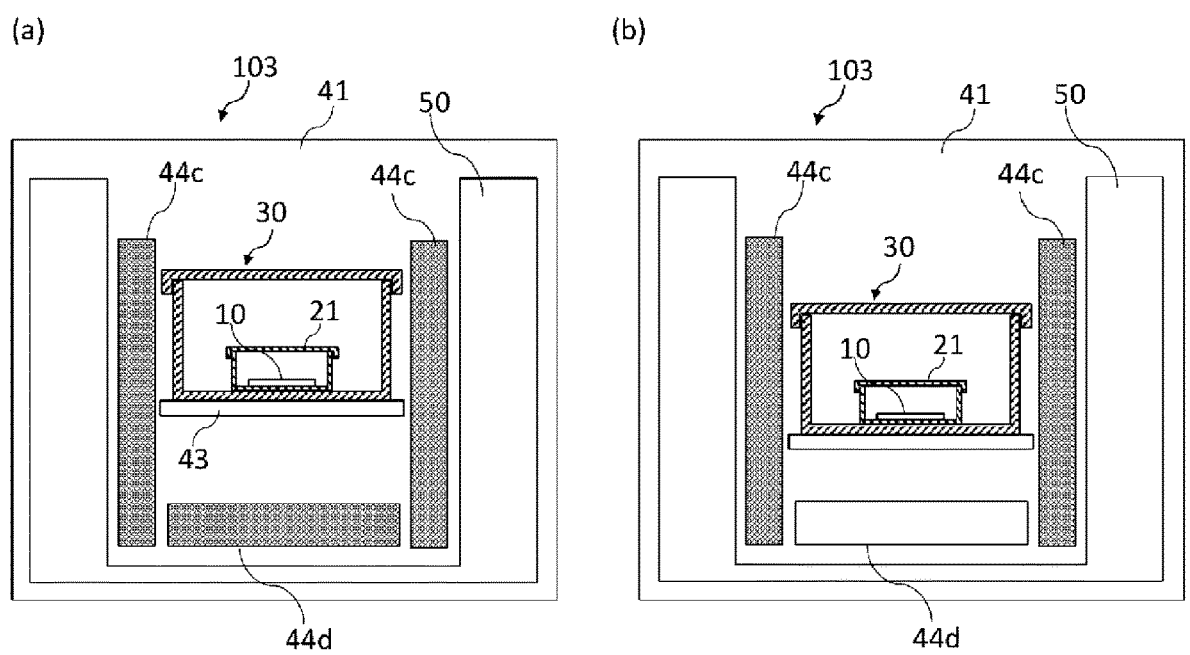
FIG. 8 is a diagram illustrating a manufacturing device including both a temperature control means and a main container control means according to Example 4.

FIG. 8 illustrates a manufacturing device 103 including a temperature control means and a main container control means.

The manufacturing device 103 includes a main heating chamber 41, a moving means 43, a side surface heating means 44c, and a bottom surface heating means 44d. In the main heating chamber 41, a heat insulating material 50 is arranged so as to surround the side surface heating means 44c and the bottom surface heating means 44.

FIG. 5(a) illustrates a state in which both the side surface heating means 44c and the bottom surface heating means 44d are operated, and the semiconductor substrate 10 is located at the center with respect to the vertical length of the side surface heating means 44c.

In this state, heating is also performed from the bottom surface side with respect to the bottom surface heating means 44d, and the semiconductor substrate 10 is located at the center with respect to the vertical length of the side surface heating means, so that a temperature gradient is formed in which the semiconductor substrate 10 is on the high temperature side and the release and reception body 21 is on the low temperature side.

In FIG. 5(b), the side surface heating means 44c operates, the bottom surface heating means 44d does not operate, and the power release and reception body 21 is located at the center of the side surface heating means 44c in the vertical direction.

In this state, the temperature gradient is such that the release and reception body 21 located at the center with respect to the vertical length of the side surface heating means is on the high temperature side and the semiconductor substrate 10 is on the low temperature side, and high and low of the temperature gradient formed between the semiconductor substrate 10 and the release and reception body 21 is inverted with respect to the state of FIG. 5(a).

As described above, by combining the temperature control means and the main container control means, a configuration of reversing the temperature gradient may be adopted.

<Example 5> Manufacturing Device Including a Plurality of Main Heating Chambers

A manufacturing device of Example 5 will be described while omitting matters described in Examples 1 to 4.

Figure 9:
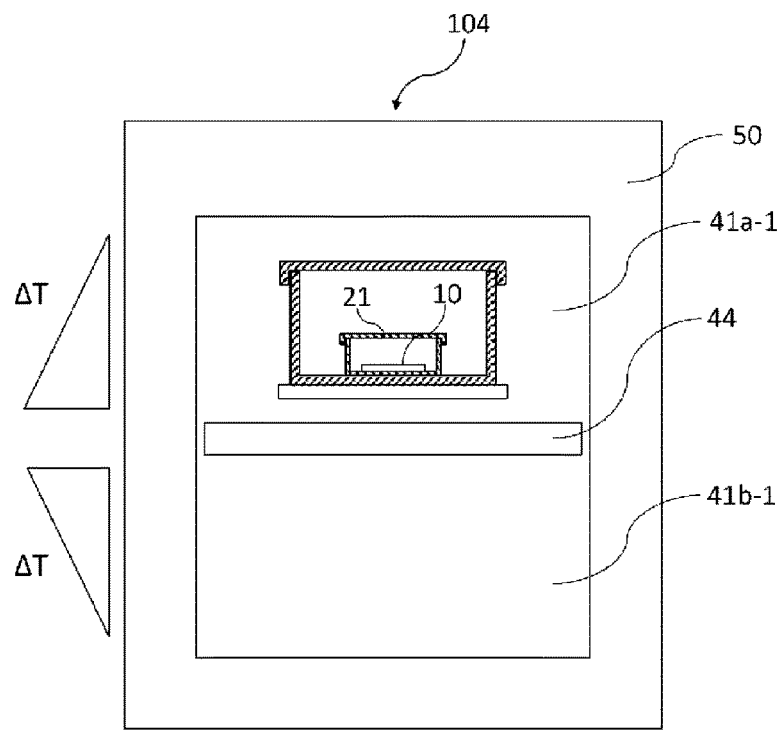
FIG. 9 is a diagram illustrating a manufacturing device including a plurality of main heating chambers according to Example 5.

FIG. 9 illustrates a manufacturing device 104 including a plurality of main heating chambers.

The manufacturing device 104 includes a first heating chamber 41a-1 and a second heating chamber 41b-1 as main heating chambers, and a heating means 44 is provided between the first heating chamber 41a-1 and the second heating chamber 41b-1. That is, the first heating chamber 41a-1 and the second heating chamber 41b-1 are adjacent to each other via the heating means 44.

By operating the heating means 44, the manufacturing device 104 generates a temperature gradient in which the vicinity of the heating means 44 is on the high temperature side and the top surface of the first heating chamber 41a-1 is on the low temperature side in the first heating chamber 41a-1. Therefore, the temperature gradient between the semiconductor substrate 10 accommodated in the first heating chamber 41a-1 and the release and reception body 21 is such that the semiconductor substrate 10 is on the high temperature side and the release and reception body 21 is on the low temperature side.

On the other hand, in the second heating chamber 41b-1, a temperature gradient occurs such that the vicinity of the heating means 44 is on the high temperature side and the bottom surface in the second heating chamber 41b-1 is on the low temperature side. Therefore, the temperature gradient between the semiconductor substrate 10 accommodated in the second heating chamber 41b-1 and the release and reception body 21 is such that the semiconductor substrate 10 is on the low temperature side and the release and reception body 21 is on the low temperature side.

Therefore, by performing the heat treatment of the semiconductor substrate 10 in any one of the first heating chamber 41a-1 and the second heating chamber 41b-1, then taking out the semiconductor substrate 10, and performing the heat treatment in the other heating chamber, it is possible to perform heating by reversing the temperature gradient formed between the semiconductor substrate 10 and the release and reception body 21.

As described above, the second heating chamber 41b-1 is configured such that the temperature gradient formed between the semiconductor substrate 10 accommodated in the first heating chamber 41a-1 and the release and reception body 21 is opposite in high and low by the heating means 44, so that it is possible to perform the heat treatment in which high and low of the temperature gradient is inverted.

Note that the names of the first heating chamber and the second heating chamber are merely names given for convenience of description, and do not specify the order of performing the heat treatment on the semiconductor substrate 10.

In the present exemplary embodiment, the heat insulating material 50 on the top surface side of first heating chamber 41a-1 and the heat insulating material 50 on the bottom surface side of second heating chamber 41b-1 may be configured to have a difference in thickness of the heat insulating material 50.

Figure 10:
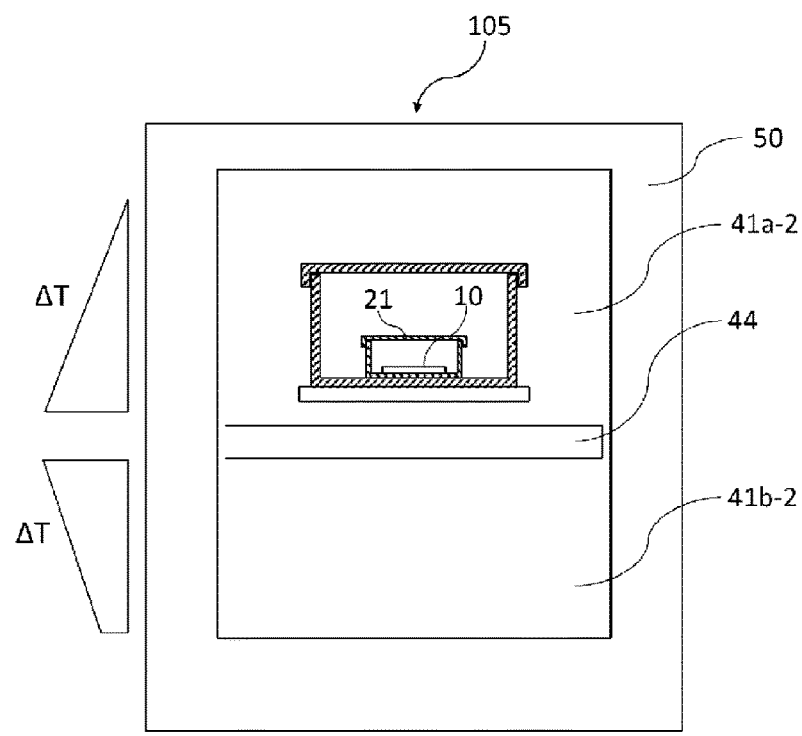
FIG. 10 is a diagram illustrating a manufacturing device including a plurality of main heating chambers having different thicknesses of heat insulating materials.

FIG. 10 illustrates a manufacturing device 105 including a first heating chamber and a second heating chamber having different thicknesses of heat insulating materials.

When the thickness of the heat insulating material 50 is thin, heat easily escapes, and a difference in temperature gradient between a surface on which the heating means is arranged and an opposing surface becomes relatively large. On the other hand, when the thickness of the heat insulating material 50 is thick, heat hardly escapes, so that a difference in temperature gradient between a surface on which the heating means is arranged and an opposing surface becomes relatively small. Therefore, by providing a difference in thickness of the heat insulating material 50 between the heat insulating material 50 on the top surface side of the first heating chamber 41a-2 and the heat insulating material 50 on the bottom surface side of the second heating chamber 41b-2, not only the high and low of the temperature gradient but also the temperature difference of the temperature gradient formed between the semiconductor substrate 10 and the power release and reception body 20 can be controlled.

Figure 11:
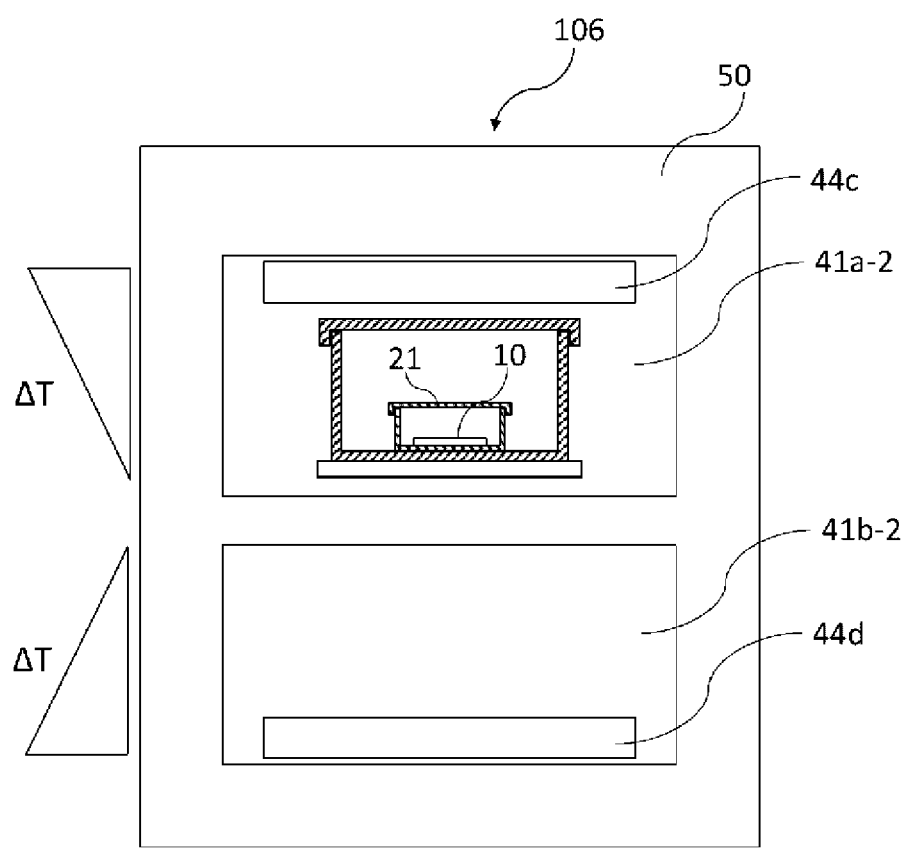
FIG. 11 is a diagram illustrating another embodiment of a manufacturing device including independent heating means in a plurality of main heating chambers."

FIG. 11 illustrates a manufacturing device 106 according to another embodiment as a manufacturing device including a plurality of main heating chambers.

A first heating chamber 41a-3 and a second heating chamber 41b-3 in FIG. 11 include independent heating means 44c and 44d, respectively.

The heating means 44c is arranged on the top surface side of the first heating chamber 41a-3, and the heating means 44d is arranged on the bottom surface side of the second heating chamber 41b-3. As described above, in the second heating chamber 41b-3, the heating means 44d is arranged at a position facing the heating means 44c, with respect to the arrangement position of the heating means 44c in the first heating chamber 41a-2, so that a configuration can be realized such that high and low of the temperature gradient is inverted with respect to high and low of the temperature gradient formed between the semiconductor substrate 10 and the release and reception body 21 in each main heating chamber.

The above-described device for manufacturing a semiconductor substrate preferably includes a mechanism that rotates an object to be heated with a direction of a temperature gradient between the semiconductor substrate and the release and reception body as a rotation axis. By rotating the object to be heated, the growth amount and the etching amount of the semiconductor substrate become uniform, and the film thickness in the surface of the semiconductor substrate tends to become uniform.

REFERENCE SIGNS LIST

10 Semiconductor substrate
11 Main surface
20 Main container
21 Transmitting and receiving body
22 Upper container
23 Lower container
24 Gap
30 High melting point container
31 Upper container
32 Lower container
33 Gap
34 Steam supply source
40 Heating furnace
41 Main heating chamber
42 Preheating chamber
43 Moving means
44 Heating means
45 Vacuum forming valve
46 Inert gas injection valve
47 Vacuum gauge
48 Opening and closing part
49 Heat absorber
50 Heat insulating material
100 to 106 Device for manufacturing semiconductor substrate

The invention claimed is:

1. A method for manufacturing a SiC semiconductor substrate, the method comprising:
a first heating process of heating a heat treatment space accommodating a SiC semiconductor substrate and a release and reception body that transports atoms to and from the SiC semiconductor substrate in a manner that a temperature gradient is formed between the SiC semiconductor substrate and the release and reception body;
a second heating process of reversing the temperature gradient between the SiC semiconductor substrate and the release and reception body and performing heating; and,
wherein the first heating process and the second heating process comprising heating the SiC semiconductor substrate in a main container made of a material containing polycrystalline SiC.

2. The method for manufacturing a SiC semiconductor substrate according to claim 1, wherein the first heating process and the second heating process are performed in a semi-closed space.

3. The method for manufacturing a SiC semiconductor substrate according to claim 1, wherein the first heating process and the second heating process are performed under an atmosphere containing an atomic species constituting the SiC semiconductor substrate.

4. A device for manufacturing a semiconductor substrate comprising:
a main container that accommodates a semiconductor substrate and a release and reception body that transports atoms to and from the semiconductor substrate;
a heating furnace including a heating chamber that accommodates the main container, and a heater that performs heating in a manner to form a temperature gradient between the semiconductor substrate and the release and reception body;
a temperature gradient inversion means that inverts high and low of the temperature gradient,
wherein the temperature gradient inversion means is one or more selected from a temperature control means that controls a temperature in the main container in the heater, a main container control means that controls a position or orientation of the main container, or a heat radiation means that radiates heat in the heating chamber to the outside of the heating chamber,
wherein the temperature control means is a means that controls a heat generation amount of the heater, or a means that controls a position or orientation of the heater;
wherein the main container control means is a moving means to reverse the high and low temperature gradient between the semiconductor substrate and the release and reception body by moving the position of the main container in the heating furnace, or a rotation mechanism to reverse the high and low temperature gradient between the semiconductor substrate and the release and reception body by rotating the main container; and
wherein the heat radiation means is an opening and closing part to reverse the high and low temperature gradient between the semiconductor substrate and the release and reception body by controlling the open and close state.

5. The device for manufacturing a semiconductor substrate according to claim 4, comprising, as the temperature gradient inversion means, two or more types of temperature gradient inversion means selected from the temperature control means, the main container control means, and the heat radiation means.

6. The device for manufacturing a semiconductor substrate according to claim 4, wherein the main container is made of a material containing a polycrystalline SiC an atomic species constituting the semiconductor substrate.

7. The device for manufacturing a semiconductor substrate according to claim 4, further comprising a high melting point container that accommodates the main container.

8. A device for manufacturing a semiconductor substrate comprising:
   a main container that accommodates a semiconductor substrate and a release and reception body that transports atoms to and from the semiconductor substrate; and
   a heating furnace including a heating chamber that accommodates the main container, and a heater that performs heating in a manner to form a temperature gradient between the semiconductor substrate and the release and reception body,
   wherein at least a first heating chamber and a second heating chamber are provided as the heating chamber,
   high and low of a temperature gradient of the second heating chamber is opposite to high and low of a temperature gradient of the first heating chamber, and
   wherein the first heating chamber and the second heating chamber are adjacent to each other via the heater.

9. A device for manufacturing a semiconductor substrate comprising:
   a main container that accommodates a semiconductor substrate and a release and reception body that transports atoms to and from the semiconductor substrate; and
   a heating furnace including a heating chamber that accommodates the main container, and a heating means that performs heating in a manner to form a temperature gradient between the semiconductor substrate and the release and reception body,
   wherein at least a first heating chamber and a second heating chamber are provided as the heating chamber, and
   high and low of a temperature gradient of the second heating chamber is opposite to high and low of a temperature gradient of the first heating chamber,
   wherein the first heating chamber and the second heating chamber each include an independent heating means.

10. A device for manufacturing a semiconductor substrate comprising:
    a main container that accommodates a semiconductor substrate and a release and reception body that transports atoms to and from the semiconductor substrate; and
    a heating furnace including a heating chamber that accommodates the main container, and a heating means that performs heating in a manner to form a temperature gradient between the semiconductor substrate and the release and reception body,
    wherein at least a first heating chamber and a second heating chamber are provided as the heating chamber, and
    high and low of a temperature gradient of the second heating chamber is opposite to high and low of a temperature gradient of the first heating chamber,
    wherein heat insulating materials having different thicknesses are respectively provided in the first heating chamber and the second heating chamber.

* * * * *